US008289762B2

(12) United States Patent
Kau et al.

(10) Patent No.: US 8,289,762 B2
(45) Date of Patent: Oct. 16, 2012

(54) DOUBLE-PULSE WRITE FOR PHASE CHANGE MEMORY

(75) Inventors: Derchang Kau, Cupertino, CA (US); Johannes J. Kalb, San Jose, CA (US); Brett Klehn, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 347 days.

(21) Appl. No.: 12/589,977

(22) Filed: Oct. 30, 2009

(65) Prior Publication Data
US 2011/0103139 A1    May 5, 2011

(51) Int. Cl.
G11C 11/00 (2006.01)
G11C 7/22 (2006.01)
G11C 7/00 (2006.01)
G11C 7/12 (2006.01)
G11C 11/21 (2006.01)

(52) U.S. Cl. ............ 365/163; 365/148; 365/189.16; 365/191

(58) Field of Classification Search ............ 365/148, 365/163, 189.16, 191
See application file for complete search history.

(56) References Cited

U.S. PATENT DOCUMENTS

| | | | |
|---|---|---|---|
| 2005/0036364 A1* | 2/2005 | Ha et al. ............ | 365/163 |
| 2006/0126380 A1* | 6/2006 | Osada et al. ............ | 365/163 |
| 2006/0215435 A1 | 9/2006 | Jeong et al. | |
| 2007/0008769 A1* | 1/2007 | Kim et al. ............ | 365/148 |
| 2007/0206410 A1* | 9/2007 | Sutardja ............ | 365/163 |
| 2008/0062751 A1* | 3/2008 | Park et al. ............ | 365/163 |
| 2008/0151613 A1* | 6/2008 | Chao et al. ............ | 365/163 |
| 2008/0273371 A1 | 11/2008 | Boris et al. | |
| 2009/0010050 A1 | 1/2009 | Panas | |
| 2009/0073753 A1* | 3/2009 | Osada et al. ............ | 365/163 |
| 2009/0231912 A1 | 9/2009 | Jun | |
| 2009/0310401 A1* | 12/2009 | Philipp et al. ............ | 365/163 |
| 2010/0165711 A1* | 7/2010 | Lee ............ | 365/163 |
| 2010/0284212 A1 | 11/2010 | Ferdinando et al. | |

OTHER PUBLICATIONS

International Search Report and Written Opinion for International Application No. PCT/US2010/050137 mailed May 13, 2011, 10 pgs.

* cited by examiner

*Primary Examiner* — J. H. Hur
(74) *Attorney, Agent, or Firm* — Blakely, Sokoloff, Taylor & Zafman LLP

(57) ABSTRACT

Double-pulse write for phase change memory including: writing a phase change material from a high RESET state to a weakened RESET state with a first step, writing the phase change material from the weakened RESET state to a SET state with a second step, the second step having a lower current than the first step, verifying a parameter of the phase change material wherein if the parameter is higher than a target for a SET state, then repeating the writing with the first step, the writing with the second step, and the verifying until the parameter is lower than the target wherein a current for the first step is decreased by a decrement with each iteration without becoming lower than a current for the second step.

20 Claims, 3 Drawing Sheets

DOUBLE-PULSE WRITE FOR PHASE CHANGE MEMORY

BACKGROUND OF THE INVENTION

1. Field of the Invention

The present invention relates to a field of electronic, such as semiconductor, devices, and, more specifically, to improving write operation for phase change random access memory.

2. Discussion of Related Art

Dynamic Random Access Memory (DRAM) and Static Random Access Memory (SRAM) are widely used to store information in an electronic system, such as a computer. However, both DRAM and SRAM are volatile memory which will lose stored information whenever electrical power is interrupted.

Consequently, it is desirable to store critical information in non-volatile memory, especially for a portable electronic system, such as a mobile internet device (MID).

Flash memory is a type of non-volatile memory. However, flash memory may not be scaleable to very small dimensions since information is stored as charge in a floating gate, and reducing the number of electrons per bit will degrade the reliability of stored information.

In addition, flash memory typically uses NAND or NOR architecture. A NAND device erases a page at a time while a NOR device erases a block at a time.

In contrast, phase-change RAM (PRAM) is a type of non-volatile memory that is scaleable to extremely small dimensions since each bit of information is stored as resistance in a material, which is a physical property that can be measured very precisely.

The PRAM also erases a bit at a time since every memory cell may be addressed separately by selecting a combination of bit line and word line.

However, a write operation is slower than a read operation for PRAM. Furthermore, the write operation is asymmetric. In particular, a SET phase (0) is slower to write than a RESET phase (1) when binary logic is used.

Accordingly, it is desirable to improve the write operation for PRAM.

DETAILED DESCRIPTION OF THE PRESENT INVENTION

In the following description, numerous details, examples, and embodiments are set forth to provide a thorough understanding of the present invention. However, it will become clear and apparent to one of ordinary skill in the art that the invention is not limited to the details, examples, and embodiments set forth and that the invention may be practiced without some of the particular details, examples, and embodiments that are described. In other instances, one of ordinary skill in the art will further realize that certain details, examples, and embodiments that may be well-known have not been specifically described so as to avoid obscuring the present invention.

A system may include a processor coupled to a memory device. The memory device may include a non-volatile memory device, such as a resistance change memory. In particular, the resistance change memory may include a resistive random access memory (RRAM) or a phase change random access memory (PRAM).

Figure 1:
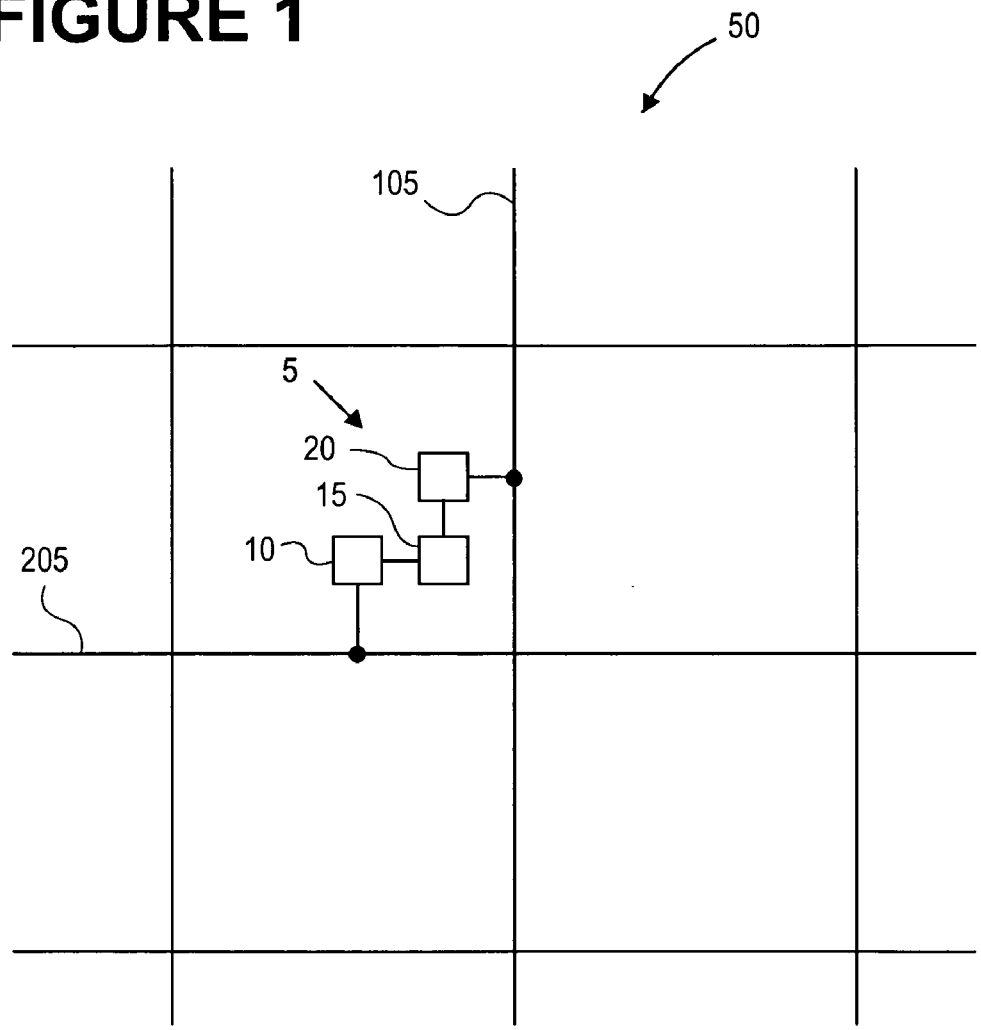
FIG. 1 shows an array of a phase change memory cell organized into bit lines and word lines according to an embodiment of the present invention.

As shown in an embodiment of the present invention in FIG. 1, the PRAM 50 includes an array of memory cells that is organized into columns and rows. A bit line 105 in a column of the array and a word line 205 in a row of the array may be addressed to access a memory cell 5. The bit line 105 and the word line 205 include conductors that are formed from a conductive material. The conductive material may include copper.

Some features shown in FIG. 1 may not be present in certain PRAM architectures. In one case, a select device 10 is not present. For example, the select device 10 may be combined with the memory element 20. In another case, a heater 15 is not present. For example, the heater 15 may be combined with the memory element 20.

Conversely, certain features that may be included in a PRAM architecture are not shown in FIG. 1. An example is a pulse generator circuit. Another example is a sense amplifier circuit. Still another example is a voltage step-up circuit.

In an embodiment of the present invention, a select device 10 (when present) is connected in series to control access to a memory element 20 in the memory cell 5. Some examples of the select device 10 include a PN diode, an NMOS transistor, and a bipolar junction transistor.

In different embodiments of the present invention, logical arrangement or physical placement of the features in the PRAM 50 may vary in a layout. For example, the select device 10 (when present) may be located towards the word line 205 side of the memory element 20 (as shown in FIG. 1) or towards the bit line 105 side of the memory element 20 (not shown).

The memory element 20 in the memory cell 5 is programmed by applying a voltage (or current). After the select device 10 (when present) turns on, a current will flow through the heater 15 (when present) and the memory element 20 that are connected in series.

The heater 15 (when present) includes a conductor that is formed from a conductive material. The conductive material may include titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, or tantalum nitride (TaN), among others.

The heater 15 (when present) is a resistive element that heats a phase change material (PCM) in memory element 20 that is connected in series. The PCM is a material that includes the following two properties: (a) it can exist locally in an amorphous phase without crystallization for a prolonged period of time, such as for several years, at room temperature, and (b) the amorphous phase can rapidly crystallize on time scales between nanoseconds and milliseconds once a temperature is raised to about 100 to 350 degrees Centigrade.

An enormous variety of potentially useful PCMs is available with widely differing amounts of characterization having been performed. The PCM may be a eutectic or a peritectic material. The PCM may be a stoichiometric or a non-stoichiometric compound. The PCM may include single-phase or multiphase materials. In various embodiments of the present invention, the PCM may have a binary composition, a ternary composition, or a quaternary composition. The PCM may be doped with various elements so the resultant compound may include 2-5 or more elements. In other embodiments of the present invention, the PCM may have a pseudo-binary composition.

In an embodiment of the present invention, the PCM may be a chalcogenide alloy which, by definition, includes at least one element from Group VI A of the periodic table, such as sulfur, selenium, or tellurium. In an embodiment of the present invention, the elements from Group VI A may form 0-95 atomic % of the PCM.

In an embodiment of the present invention, the PCM may include 1-2 elements from Group IV A of the periodic table, such as silicon, germanium, or tin. In an embodiment of the present invention, the elements from Group IV A may form 0-60 atomic % of the PCM. Examples include GeTe and TeGeSn.

In an embodiment of the present invention, the PCM may include 1-2 elements from Group V A of the periodic table, such as phosphorus, arsenic, antimony, or bismuth. In an embodiment of the present invention, the elements from Group V A may form 2-90 atomic % of the PCM. Examples include SbSe, SbTe, BiSe, and BiSeSb.

Some PCM include elements from Group IV A, Group V A, and Group VI A. Examples include GeSbTe and SnSbTe.

In an embodiment of the present invention, the PCM may include 1-2 elements from Group III A of the periodic table, such as gallium or indium. In an embodiment of the present invention, the elements from Group III A may form 0.5-25 Atomic % of the PCM. An example includes InSe.

Some PCM include elements from Group III A, Group V A, and Group VI A. Examples include GaSbTe and InSbTe.

In still another embodiment of the present invention, the PCM may further include other elements from the periodic table, such as silver and gold from Group I B. Examples include AgSbTe, GeSbTeAg, AgInSbTe, AuInSbTe, and TeGeSnAu.

In yet another embodiment of the present invention, the PCM may further include still other elements from the periodic table, such as cobalt and palladium from Group VIII B. Examples include InSeTeCo and TeGeSnPd.

In an embodiment of the present invention, the PCM might not include any element from Group VI A and, thus, is not a chalcogenide. Examples include GeSb, GaSb, and InSb.

The PCM has a resistivity that is programmable by heating up to a certain temperature followed by cooling at a certain rate. The process includes joule heating. Depending on a profile of temperature as a function of time, the phase change material may change between an amorphous (RESET) phase and a crystalline (SET) phase that differ significantly in electrical resistivity.

Figure 2:
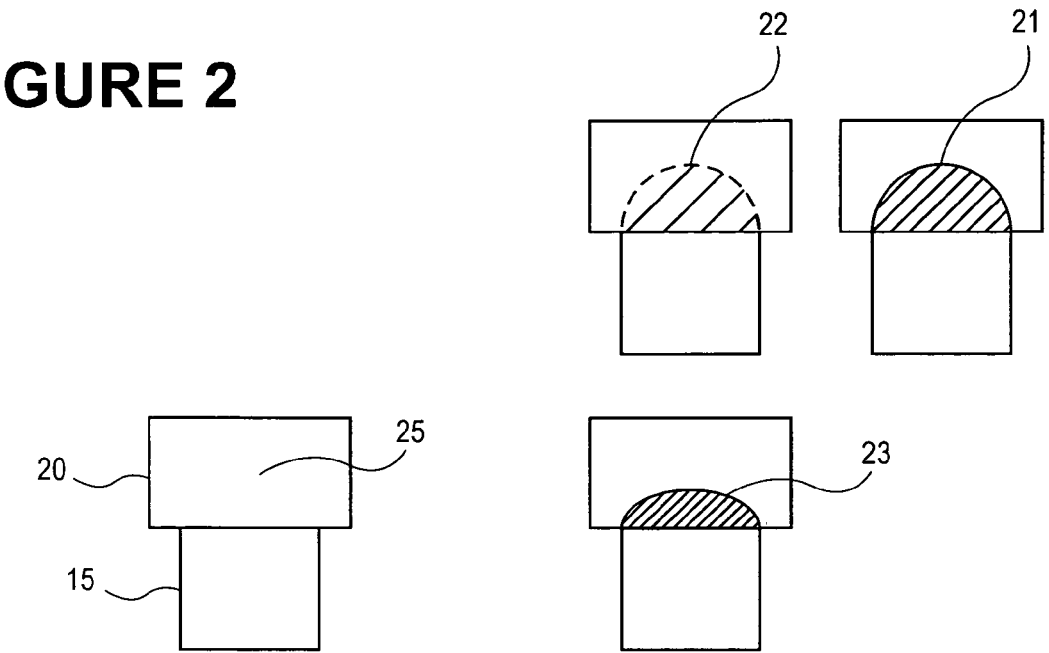
FIG. 2 shows an elevation view of a PCM for a write from a RESET state to a SET state according to an embodiment of the present invention.

As shown in an elevation view in FIG. 2, the memory cell 5 may include a heater 15 (when present) and a memory element 20. The heater 15 (when present) may include a lance (as shown in FIG. 2) or a micro-trench (not shown).

The resistivity ratio between the 2 phases (logic states) of the PCM may be selected from a range of $10^2$-$10^5$. In an embodiment of the present invention as shown in FIG. 2, the RESET state 21 includes a high resistivity state, such as $10^6$-$10^8$ Ohms, while the SET state 25 includes a low resistivity state, such as $10^3$-$10^4$ Ohms.

Figure 3:
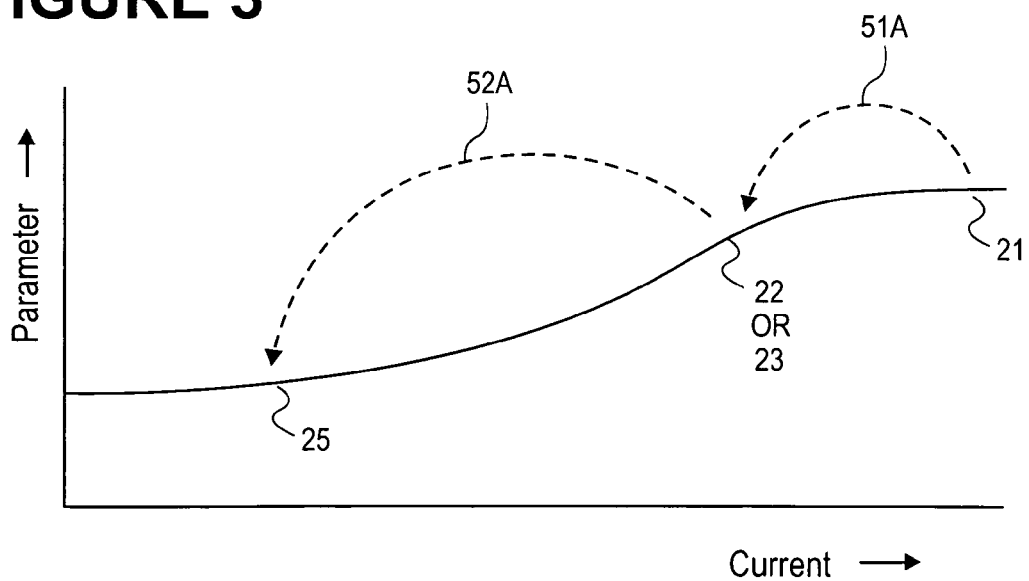
FIG. 3 shows a two-step process to write a PCM from a RESET state to a SET state according to an embodiment of the present invention.

A graph of a parameter of the PCM as a function of current is shown as a single curve in FIG. 3. The parameter of the PCM may include resistance (ohms) or threshold voltage (volts). In an embodiment of the present invention, the current of the PCM may vary from 0.1 to 2.0 mA. Variability in the parameter of the PCM will result in a family of curves (not shown) that is similar to the single curve shown in FIG. 3.

In an embodiment of the present invention, the resistance of the PCM may vary from $10^3$ to $10^8$ Ohms. In an embodiment of the present invention, the threshold voltage of the PCM may vary from 0 to 3.5 volts for example. A phase change material would have a $V_{TH}$ of zero in the set state. The flatter and almost horizontal portions of the curve to the left and to the right in FIG. 3 indicate greater stability of the corresponding states shown in FIG. 2.

The PRAM 50 uses a single-level cell (SLC) if it stores 1 bit of data in the memory cell 5. An array that stores 1 bit of data in each memory cell will have 2 logical states per memory cell. The data values corresponding to the 2 logical states include '1' and '0'.

The present invention envisions a two-step write process to SET the phase change memory. As shown in an embodiment of the present invention in FIG. 2, the PCM in the memory element 20 may be written (programmed) from one distinct memory state, such as a fully RESET state 21, to another distinct memory state, such as a fully SET state 25.

According to an embodiment of the present invention, two steps are used in the write (SET) process. Sufficient SET-to-RESET statistics for a specific PRAM technology are collected and used to determine optimal amplitude, duration, and current vs. time profile for the two steps of the process in the present invention.

The first step re-melts and quenches the PCM. A single pulse with a relatively large amplitude of current, but lower than the pulse that brought the bit to the original RESET state 21, and a very short duration is used. The duration depends on (a) thermal conduction time of the PCM (in the memory element 20), the heater 15 (when present), and surrounding materials, (b) the size of the bit, and (c) the architecture of the PRAM 50.

The second step has low energy which involves a small amplitude of current or a short duration or both. In general, one or more pulses may be used for the second step of the two-step process. When used, multiple pulses need not have the same amplitude or duration.

In order to simplify exposition, a double-pulse process, where the first step includes a first current pulse and the second step includes a second current pulse, will be described next as an embodiment of the two-step process of the present invention.

The present invention envisions using a first current pulse that is short (in duration). A short current pulse will have a steep rising edge and/or a steep falling edge. A short current pulse also has a reduced sweep (in time).

In an embodiment of the present invention, the first current pulse has a duration of 300-600 nsec. In another embodiment of the present invention, the first current pulse has a duration of 80-300 nsec. In still another embodiment of the present invention, the first current pulse has a duration of 10-80 nsec.

Although not required, in an embodiment of the present invention, the first current pulse may be rectangular. A rectangular current pulse is a current pulse (of any duration) with a substantially vertical rising edge and a substantially vertical falling edge. However, a current pulse may no longer be rectangular and, instead, appears rounded when the duration becomes very short. The amplitude of the pulse may also appear to be affected when the duration becomes extremely short.

In an embodiment of the present invention, the second current pulse may have low energy (either short in duration or small in amplitude or both). The second current pulse may have the same duration or a different duration when compared with the first current pulse. The second current pulse may have the same or a different current vs. time profile when compared with the first current pulse.

In an embodiment of the present invention, the second current pulse may include a significant sweep, such as a gradual trailing edge.

Using a short current pulse, whether for the first current pulse and/or for the second current pulse, will increase a write (SET) speed. A write (SET) power is a product of current and voltage. A write (SET) energy is a product of power and time so the write (SET) energy is reduced by using short pulses. A write (SET) efficiency is improved as well.

Figure 4:
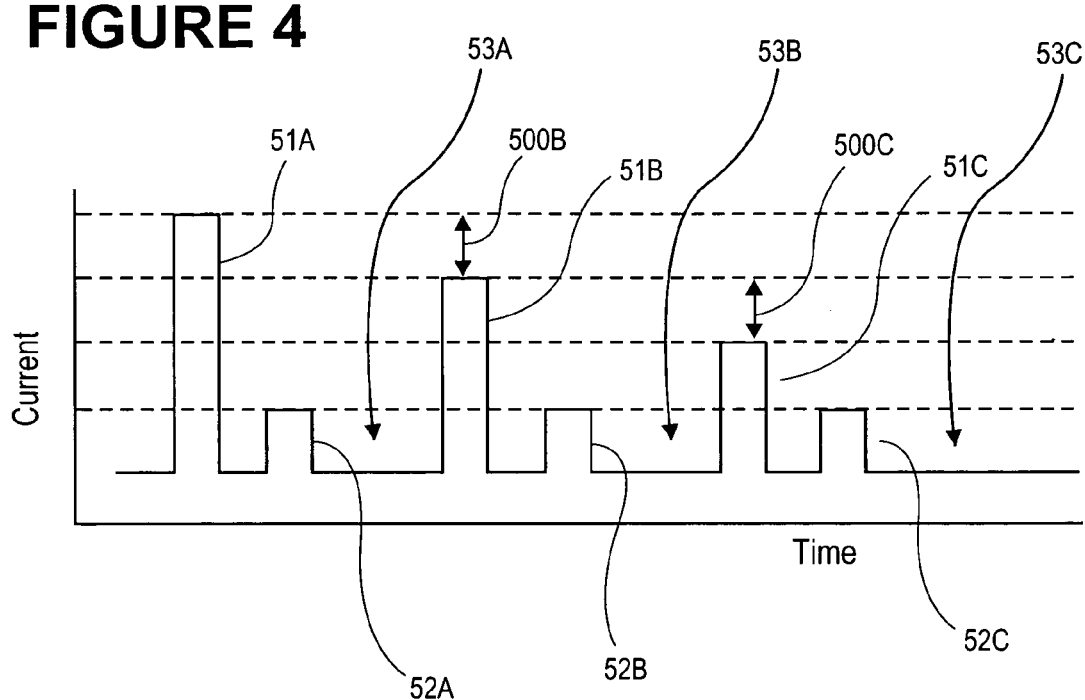
FIG. 4 shows a double-pulse process to write a PCM from a RESET state to a SET state according to an embodiment of the present invention.

According to an embodiment of the present invention as shown in FIG. 4, double pulses, such as of current, are used for the write (SET) process.

A first write pulse 51A is used to weaken a RESET state of the memory cell 20. In an embodiment of the present invention, the first write pulse 51A may be considered as a "RE-RESET" pulse. In particular, the first write pulse 51A writes the memory cell 20 from a high RESET state 21 to a weakened or low RESET state 22 or 23, as shown in FIG. 2.

The RESET level, whether high or weakened (low), refers to a parameter of the PCM, as shown in FIG. 3. The parameter of the PCM may include a resistance R or a threshold voltage $V_{TH}$ or both.

The high RESET state 21 involves an amorphous volume in the PCM. The amorphous volume is shown as an amorphous dome in FIG. 2. However, other geometries may be used for the PCM in the memory cell 20. For example, depending on architecture of the PRAM 50, the amorphous volume may include an amorphous line (not shown) or an amorphous bridge (not shown).

The first write pulse 51A may re-melt the PCM to some extent. Two of many intermediate states in the PCM that may be traversed are shown schematically in FIG. 2.

In one case, all of the amorphous dome may be melted partially. The low RESET state 22 may involve crystallization during the first write pulse 51A, such as occurring by little crystal nucleation centers inside the amorphous volume which remains almost the same size.

In another case, part of the amorphous dome may be melted completely. The low RESET state 23 may involve a reduced, such as a flattened, amorphous volume resulting from melting of a smaller sub-volume or a crystallization occurring from a rim of the amorphous volume during the first write pulse 51A.

In an embodiment of the present invention, the first write pulse 51A starts with a large amplitude and then decreases the amplitude with each repetition or iteration until the bit passes the verification.

In an embodiment of the present invention, an initial value for the first write pulse 51A is chosen to be a current that brings the bit to a resistance value that is 85-95% of the resistance for the original RESET state 21.

In another embodiment of the present invention, an initial value for the first write pulse 51A is chosen to be a current that brings the bit to a resistance value that is 75-85% of the resistance for the original RESET state 21.

Next, a second write pulse 52A is chosen to SET the weakened RESET state. In an embodiment of the present invention, the second write pulse 52A is a SET pulse. The second write pulse 52A should always have a smaller amplitude than the first write pulse 51A.

In an embodiment of the present invention, the second write pulse 52A has a current level that is below a SET disturb current so that RESET will not occur regardless of which bit in the array of the PRAM 50 is being written. This will accommodate variability in the memory element 20, including the PCM, in the memory cell 5 of the PRAM 50.

Then, a verify pulse 53A is performed to check a state of the memory cell 5. A READ operation for the memory cell 5 is performed by using a low voltage. In an embodiment of the present invention, the READ voltage is chosen with a low value so that no phase change will occur in the memory element 20. In another embodiment of the present invention, the READ voltage is chosen to result in some crystallization which would be beneficial.

A parameter, such as resistance R or threshold voltage $V_{TH}$ or both, may be measured for the verify pulse 53A. The parameter is compared with a target. The target may be predetermined. The target may depend on SET-to-RESET statistics collected for a specific PRAM technology. The statistics may be based on measurements of actual PRAM 50 devices or may be based on simulation with proprietary models.

If a bit fails the verification, a procedure is repeated. A repetition or iteration involves choosing a new first write pulse 51B with a lower amplitude than 51A while, if desired, keeping the amplitude constant for a second write pulse 52B. The lower amplitude for the new first write pulse 51B should not fall below the, if desired, constant amplitude of the second write pulse 52B.

In an embodiment of the present invention, the second write pulse 52B is not kept constant and, instead, differs in amplitude from the previous second write pulse 52A. As desired, the second write pulse 52B may have a smaller or larger amplitude than the previous second write pulse 52A.

The lower amplitude for the new first write pulse 51B for each repetition or iteration may be chosen by using a variety of methods, such as a linear decrement method. Alternatively, the lower amplitude for the new first write pulse 51B for each repetition or iteration may be chosen by using a binary search method. Choosing a larger decrement 500B may decrease precision, but also reduce a total number of repetitions or iterations required. If desired, the decrement may change for every repetition or iteration. Alternatively, the decrement becomes progressively smaller with each repetition or iteration.

If the bit fails after verify pulse 53B, the procedure is repeated again. The iteration involves choosing another new first write pulse 51C with a lower amplitude than 51B while, if desired, keeping the amplitude constant for the second write pulse 52C. The lower amplitude for the new first write pulse 51C should not fall below the, if desired, constant amplitude of the second write pulse 52C.

In an embodiment of the present invention, the second write pulse 52C differs in amplitude from the previous second write pulses 52A or 52B. As discussed previously, the second write pulse 52C may have a smaller or larger amplitude than the previous second write pulse 52A or 52B.

Similarly, the lower amplitude for the new first write pulse 51C may be chosen by using a variety of methods, such as a linear decrement or a binary search. Choosing a larger decrement 500C may reduce the number of repetitions or iterations required. The subsequent decrement 500C and the earlier decrement 500B need not be the same and may be quite different.

The process may be repeated, as needed, such as with a further pair of short pulses 51D, 52D (not shown) followed by a further verification 53D (not shown) and so forth. However, the amplitude for any iteration of the first write pulse should always be higher than the amplitude of any iteration of the second write pulse 52C.

In another embodiment of the present invention, the first write pulse (not shown) starts with a small amplitude and then increases the amplitude with each repetition or iteration until the bit passes the verification. In an embodiment of the present invention, an initial value for the first write pulse (not shown) is chosen to be 5-15% of a parameter, such as resistance or current. In another embodiment of the present invention, the initial value for the first write pulse (not shown) is chosen to be 15-25% of the parameter, such as resistance or current.

The two-step SET process of the present invention may also be applied to a multi-level cell (MLC) for which the PRAM 50 stores multi-bit of data in the memory cell 5.

In one case, an array that stores 2 bits of data in the memory cell 5 will have 4 logical states per memory cell. The data values corresponding to the 4 logical states include '11', '01', '00', and '10'.

In another case, an array that stores 3 bits of data in the memory cell 5 will have 8 logical states per memory cell. In another case, an array that stores 4 bits of data in each memory cell will have 16 logical states per memory cell.

For the MLC, different values of the parameter, such as resistance or threshold voltage, of the memory element 20 may be achieved by altering the amplitude (uA) and/or duration (ns) of the current pulses during writing (programming) of "RE-RESET" (in the first step) followed by writing (programming) of SET (in the second step) to form incomplete phase transitions.

Alternatively, for the MLC, different values of the parameter, such as resistance or threshold voltage, of the memory element 20 may be achieved by keeping amplitude constant and keeping duration constant for a current and then varying the number of current pulses to be used.

The incomplete phase transitions may involve different volume, cross-sectional area, 3-dimensional shape, nucleation size, or extent of crystallinity (or amorphousness) for the PCM in the memory element 20.

The incomplete phase transitions may involve intermediate states in the PCM. The intermediate states may be chosen based upon repeatability of the phase change process. The intermediate states may be chosen based upon stability of the phase change material. The intermediate states may be chosen based upon reliability of the memory cell 5. The intermediate states may be chosen based upon the architecture for the PRAM 50.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method comprising:
   writing a phase change material from a first RESET state to a second RESET state with a first step;
   writing said phase change material from said second RESET state to a SET state with a second step, said second step having a lower current than said first step;
   verifying a parameter of said phase change material wherein if said parameter is higher than a target for said SET state, then repeating said writing with said first step, said writing with said second step, and said verifying until said parameter is lower than said target wherein a current for said first step is decreased by a decrement with each iteration without becoming lower than a current for said second step.

2. The method of claim 1 wherein said first step comprises a pulse with a short duration.

3. The method of claim 1 wherein said second step comprises one or more pulses with short duration and/or low amplitude.

4. The method of claim 1 wherein said first step and said second step have steep rising edges and/or steep falling edges.

5. The method of claim 1 wherein said parameter is threshold voltage.

6. The method of claim 1 wherein said parameter is resistance.

7. The method of claim 1 wherein said first RESET state is a high RESET state of said phase change material.

8. The method of claim 1 wherein said second RESET state is a weakened or low RESET state of said phase change material.

9. The method of claim 1 wherein said decrement is chosen by a linear decrement method.

10. The method of claim 1 wherein said decrement is chosen by a binary search method.

11. The method of claim 1 wherein said decrement is different for each repetition or iteration.

12. A method comprising:
    writing a phase change material from a RESET state to a SET state with two pulses comprising a first pulse with an amplitude that is always higher than for a second pulse;
    verifying that a parameter of said phase change material becomes lower than a predetermined target for said SET state, wherein said parameter comprises threshold voltage or resistance, but if said parameter remains higher than the predetermined target, then decreasing amplitude for said first pulse and repeating said writing and said verifying.

13. The method of claim 12 wherein said first pulse writes said phase change material from a high RESET state to a weakened or low RESET state.

14. The method of claim 12 wherein said second pulse writes said phase change material from said weakened or low RESET state to a SET state.

15. The method of claim 12 wherein said first pulse has a short duration and said second pulse has a short duration and/or low amplitude.

16. The method of claim 12 wherein said decreasing amplitude involves a progressively smaller change in amplitude with each repetition or iteration.

17. A device comprising:
    a select device coupled to a word line or a bit line in an array;
    a heater connected in series to said select device;
    a memory cell connected in series to said heater; and
    a phase change material in said memory cell wherein said phase change material is written from a RESET state to a SET state by a two step process which is verified and repeated until a target parameter is achieved wherein said parameter is resistance or threshold voltage, a first step of the two step process having a higher current than a second step of the two step process and wherein the current for the first step is decreased by a decrement with each iteration without becoming lower than the current for the second step.

18. The device of claim 17 wherein a first pulse in the two step process is always has a higher current than a second pulse in the two step process for each repetition.

19. The device of claim 17 wherein said select device and said memory cell are combined.

20. The device of claim 17 wherein said heater and said memory cell are combined.

* * * * *